Sept. 11, 1951 L. C. SHAPIRO 2,567,860

TUNING MECHANISM FOR SUPERHETERODYNE RADIO RECEIVERS OF THE STEP TUNED-TYPE

Filed Nov. 18, 1946 5 Sheets-Sheet 1

Inventor
LAZARUS C. SHAPIRO
By Herman L. Gordon
Attorney

Sept. 11, 1951 L. C. SHAPIRO 2,567,860

TUNING MECHANISM FOR SUPERHETERODYNE RADIO RECEIVERS OF THE STEP TUNED-TYPE

Filed Nov. 18, 1946 5 Sheets-Sheet 2

Inventor
LAZARUS C. SHAPIRO

By Herman L. Gordon
Attorney

Sept. 11, 1951 L. C. SHAPIRO 2,567,860

TUNING MECHANISM FOR SUPERHETERODYNE RADIO RECEIVERS OF THE STEP TUNED-TYPE

Filed Nov. 18, 1946 5 Sheets-Sheet 3

Inventor
LAZARUS C. SHAPIRO

By Herman L. Gordon
Attorney

Sept. 11, 1951 L. C. SHAPIRO 2,567,860
TUNING MECHANISM FOR SUPERHETERODYNE RADIO
RECEIVERS OF THE STEP TUNED-TYPE
Filed Nov. 18, 1946 5 Sheets-Sheet 4

Inventor
LAZARUS C. SHAPIRO

By Herman L. Gordon
Attorney

Sept. 11, 1951 L. C. SHAPIRO 2,567,860

TUNING MECHANISM FOR SUPERHETERODYNE RADIO RECEIVERS OF THE STEP TUNED-TYPE

Filed Nov. 18, 1946 5 Sheets-Sheet 5

Inventor
LAZARUS C. SHAPIRO

By Herman L. Gordon
Attorney

Patented Sept. 11, 1951 2,567,860

UNITED STATES PATENT OFFICE 2,567,860

TUNING MECHANISM FOR SUPERHETERODYNE RADIO RECEIVERS OF THE STEP-TUNED TYPE

Lazarus C. Shapiro, New York, N. Y., assignor, by mesne assignments, to Arthur A. Glass, New York, N. Y.

Application November 18, 1946, Serial No. 710,425

4 Claims. (Cl. 250—20)

This invention relates to tuning arrangements for radio receivers, and more particularly, to tuning arrangements of the intermittent or step-wise operating type.

A main object of the invention is to provide a novel and improved arrangement for tuning a radio receiver wherein tuning is accomplished by very simple manual operations and wherein extreme tuning accuracy, stability, and reliability of performance is obtained.

A further object of the invention is to provide an improved mechanism for tuning radio receivers of the step-tuned type, wherein tuning to any desired step frequency may be accomplished by the manipulation of a single control element rather than by the manipulation of a plurality of control elements.

A still further object of the invention is to provide an improved mechanism for tuning radio receivers of the step-tuned type, wherein tuning is accomplished by the adjustment of a coarse selector means and a fine selector means, the mechanism functioning to adjust both the coarse selector means and the fine selector means to their required settings by the manipulation of a single control knob.

A still further object of the invention is to provide an improved means for step-tuning radio receivers, wherein the required adjustment of both a coarse selector means and a fine selector means may be obtained at the option of the operator either by manipulating a single control element or by manipulating a pair of control elements.

A still further object of the invention is to provide an improved means for step-tuning radio receivers wherein the required adjustment of both a coarse selector means and a fine selector means may be obtained by the continuous movement of a single control element so as to permit the operator conveniently to scan the band in search of a desirable program.

A still further object of the invention is to provide an improved means for step-tuning radio receivers wherein the required adjustment of both a coarse selector means and a fine selector means may be obtained by the continuous movement of a single control element so as to permit the operator conveniently to scan the band in search of a desirable program, and wherein, at the option of the operator, the coarse selector means may be independently adjusted by manipulation of an independent control element so as to permit the operator to traverse the band rapidly without scanning.

A still further object of the invention is to provide an improved means for step-tuning radio receivers wherein the control elements for manipulation of both a coarse selector means and a fine selector means are rotatable in operation and are mounted concentrically.

Further objects and advantages of the invention will become apparent from the following description and claims, and from the accompanying drawings, wherein:

Figure 1:
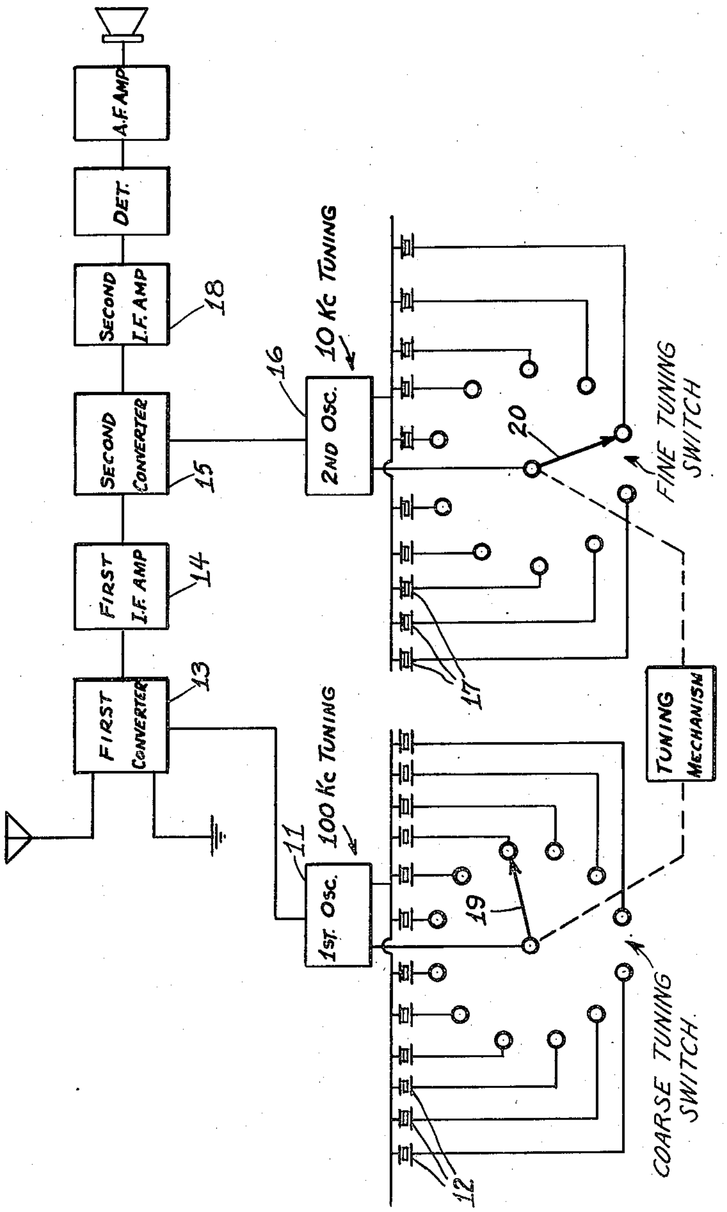
Figure 1 is a block diagram of a radio receiver employing a tuning arrangement according to the present invention.
Figure 2:
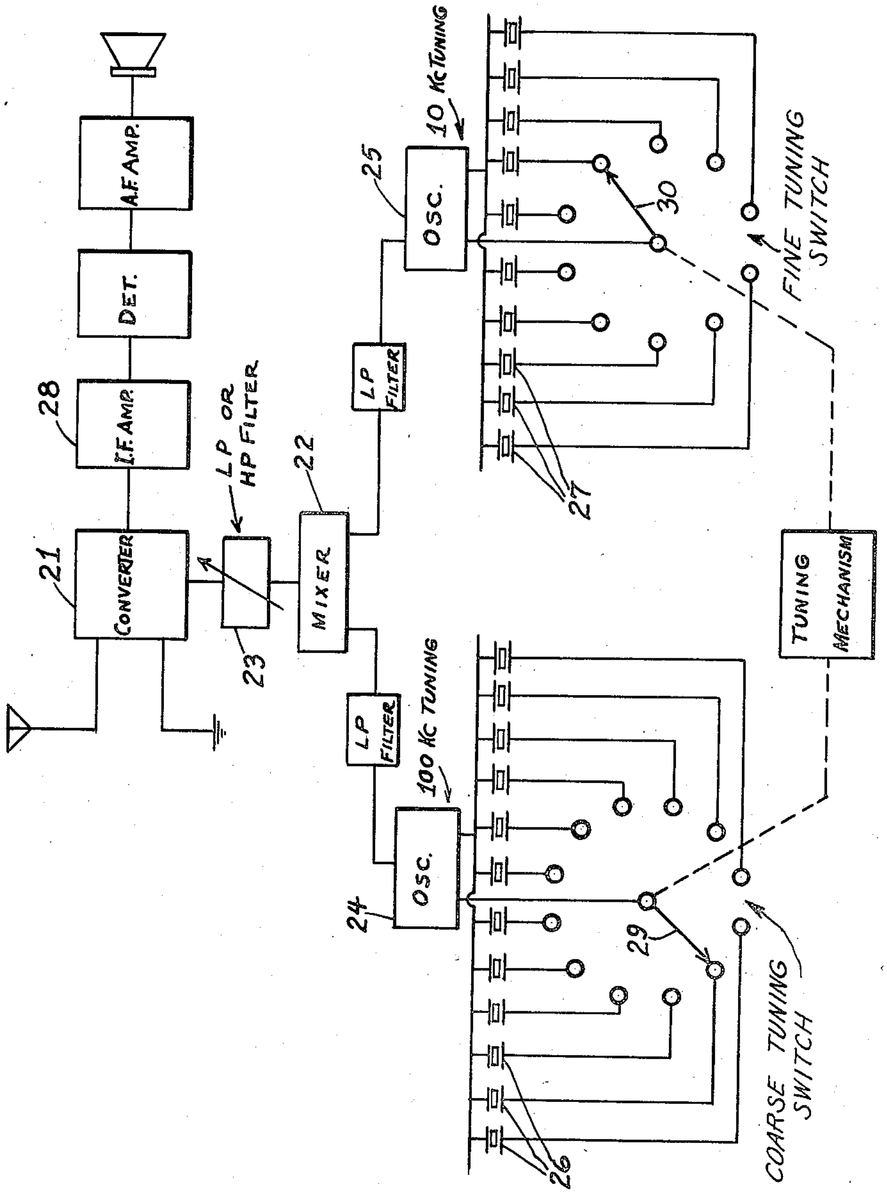
Figure 2 is a block diagram of another type of radio receiver employing a tuning arrangement according to the present invention.
Figure 3:
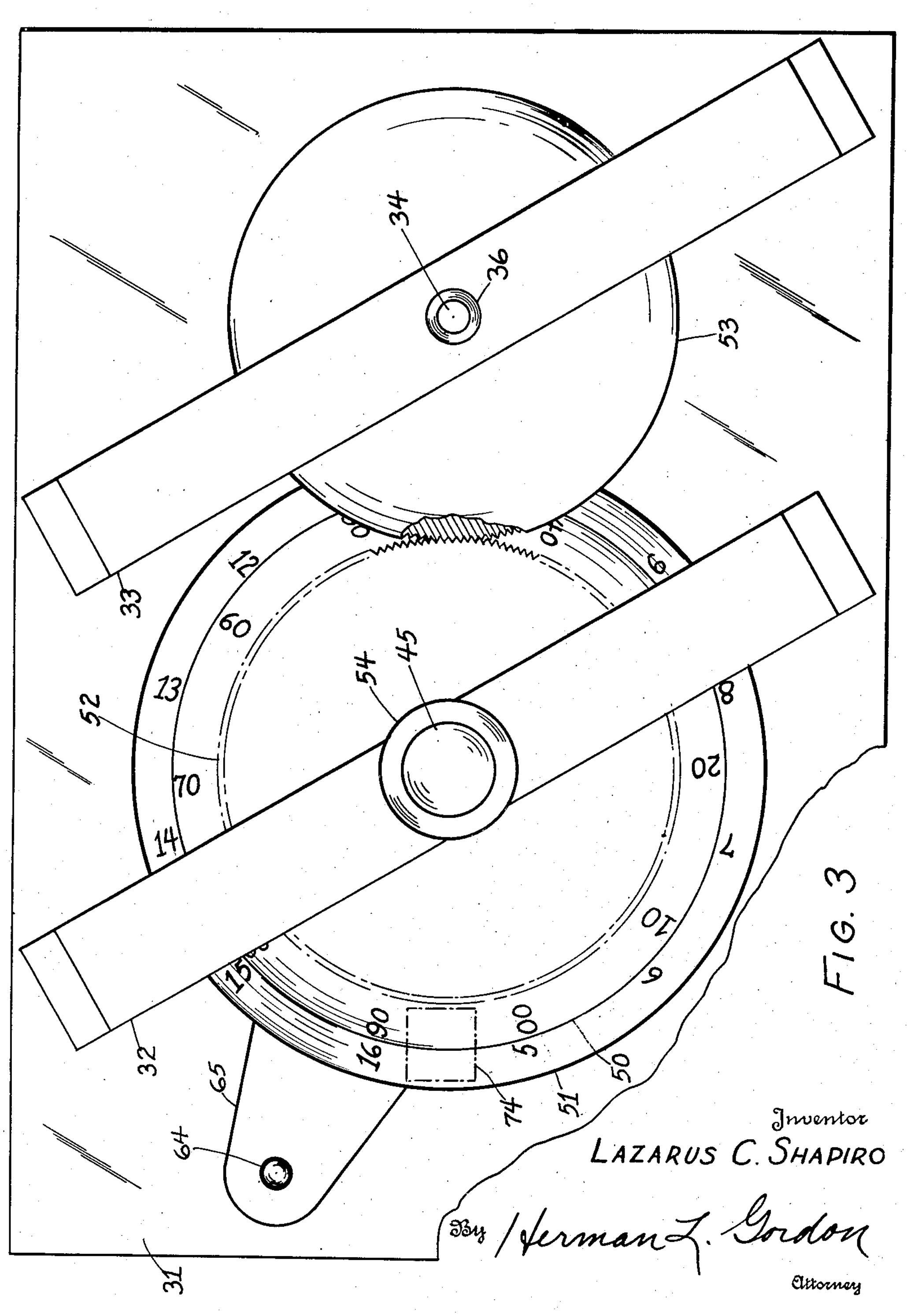
Figure 3 is a front view of a tuning mechanism constructed in accordance with the present invention.

Referring to Figure 1 and 2, two types of step-tuned radio receivers of the superheterodyne class are shown by block diagrams, the electrical features and details of which are more fully described in copending applications of Henry M. Bach, Serial No. 612,931, filed August 27, 1945, now Patent No. 2,501,591, issued March 21, 1950, and Serial No. 623,680, filed October 22, 1945, now Patent No. 2,529,443, issued November 7, 1950. In the receiver illustrated by block diagram in Figure 1, 11 designates a first piezo-electric crystal-controlled oscillator whose frequency may be varied in 100 kc. steps by switching the oscillator to any one of a series of crystals 12 differing in frequency by 100 kc. The output of oscillator 11 is fed to a first converter 13 where it is mixed with an input signal, the input signal frequencies being multiples of 10 kc. The resultant frequency thus derived is fed to a first intermediate frequency amplifier 14 having a band pass characteristic over a predetermined band 100 kc. wide. The amplified signal is fed to a second converter 15. Also fed to second converter 15 is the output of a second crystal controlled oscillator 16 whose frequency is variable in 10 kc. steps by connecting it to any one of a series of ten crystals 17 differing in frequency by 10 kc. intervals. The resultant output carrier from converter 15 is amplified in a second intermediate frequency amplifier 18 which accepts a predetermined carrier frequency from converter 15. Said predetermined carrier frequency will be modulated by a signal carrier determined by the selected combination of crystals 12 and 17. A switch 19 is employed to select the 100 kc. step crystals 12 and a switch 20 is employed to select the 10 kc. step crystals 17. In the above cited copending applications push button switches are employed to select the crystals, one push button switch being required for each crystal.

In Figure 2 a somewhat different electrical system is employed. The input carrier, which is a multiple of 10 kc., is fed into a converter 21. Also fed into converter 21 from a mixer 22 through a two-position filter 23 is a resultant frequency which is obtained by mixing the outputs of a first crystal controlled oscillator 24 and a second crystal controlled oscillator 25. The output frequency of oscillator 24 is variable in 100 kc. steps by connecting oscillator 24 to any one of a series of crystals 26 which differ in frequency by 100 kc. The output frequency of oscillator 25 is variable in 10 kc. steps over a range of 100 kc. by connecting oscillator 25 to any one of ten crystals 27 which differ in frequency by 10 kc. Filter 23 is adjustable so as to pass either a low range of output frequencies (derived from the difference between the two local oscillator frequencies) from mixer 22, to be employed in selecting standard broadcast channels, or a high range (derived from the sum of the two local oscillator frequencies), to be employed in selecting short-wave channels. The crystals 26 and 27 are chosen so that the low range frequencies passed by filter 23 into converter 21 will combine with standard broadcast input signals in said converter to produce an intermediate frequency acceptable to the intermediate frequency amplifier 28 and which may be thereafter handled by the receiver in a conventional manner. Similarly, the frequencies passed by filter 23 in its adjusted high range position combine with short wave input signals in converter 21 to produce the acceptable intermediate frequency. A switch 29 is employed to select the 100 kc. step crystals 26 and a switch 30 is employed to select the 10 kc. step crystals 27. In co-pending application Serial No. 612,931, push button switches are employed to select the crystals, one push button switch being required for each crystal.

The tuning system employed in the receiver illustrated in either Figure 1 or Figure 2 facilitates rapid selection of any predetermined frequency. For example, if a broadcasting station such as WJZ is known to have a desirable program, and its frequency, 770 kc., is known, the station may be quickly selected by selecting the proper step on the 100 kc. control and by selecting the proper step on the 10 kc. control to provide the required receiver tuning. Numbered push buttons may be provided for the respective controls, so that the station may be tuned in, for example, by pressing a push button marked "7" at the 100 kc. control panel and by also pressing a push button marked "70" at the 10 kc. control panel. The use of push buttons facilitates this type of operation and rapid selection of stations having predetermined known frequencies may be accomplished by this system. However, if the listener does not know the program schedule, has not consulted his newspaper to determine desirable station frequencies, or has not determined which program will best suit his fancy, he is compelled, with any receiver such as above described using two push-button selector controls, to go through a laborious procedure in scanning the band so as to listen to all available stations in succession. The scanning procedure is laborious even if the listener has memorized the frequencies of all the local stations, but it is much more laborious if he does not remember these frequencies and is compelled to press in succession ten buttons covering ten 10 kc. steps, then to press the next 100 kc. button, then again to press the ten buttons covering the ten 10 kc. steps, and so forth, until he has covered the total range of about 1100 kc.

In an effort to devise a solution of the frequency scanning problem in connection with a push button tuning arrangement, numerous expedients such as mechanical interlocks between the two groups of push buttons, local card indexes, colored buttons, and the like have been considered; and all these expedients were discarded because they did not accomplish the fundamental purpose, which was to permit continuous scanning from one end of the band to the other by means of a single control.

The device which is employed as a solution to this problem utilizes a rotary tuning mechanism in which two shafts control respectively the two selector switches. (For the broadcast band, the first selector switch provides steps of 100 kc. each and the second selector switch provides steps of 10 kc. each. The same controls may be employed for tuning in the FM bands, wherein the first selector switch provides steps of 1 megacycle each and the second selector switch provides steps of 200 kc. each.) The second selector shaft is the manually driven shaft and controls the position of the first selector shaft by means of an intermittently actuated mechanism arranged to advance the first selector shaft one step for each revolution of the second selector shaft. The first selector shaft is held stationary during almost an entire revolution of the second selector shaft, and makes its one-step advance in the interval during which the second selector shaft advances one step at the end of a complete revolution. For example, in the decimal system employed in the broadcast band, the first selector shaft may remain stationary at a position corresponding to the "7" 100 kc. coarse step position while the second selector shaft is rotated from the "00" to the "90" 10 kc. fine step positions, and then advances to the "8" 100 kc. coarse step position while the second selector shaft advances from the "90" to the "00" 10 kc. fine step position. This intermittent action is reversible, i. e., a backward rotation of the second selector shaft from the "00" to the "90" 10 kc. fine step position produces a backward movement of the first selector shaft through one 100 kc. coarse step, such as from "8" to "7." Therefore, by rotation of a knob on the second selector shaft continuously in one direction it is possible to scan or explore the entire broadcast frequency spectrum.

For the sake of convenience in reading frequency, two transparent dials representing respectively the two selector controls are mounted concentrically with respect to one shaft. The numbers on these transparent dials are printed in such position that the last two digits representing ten kilocycle points fall in juxtaposition with the one or two digits representing hundreds of kilocycles, and when illuminated from behind by a dial light and viewed through a front window they appear as a single number indicating the frequency to which the receiver is tuned. In the present embodiment the two concentric transparent dials are mounted on the second control shaft. One dial (the 10 kc. dial) is rigidly secured to said second control shaft, and the other dial (the 100 kc. dial) is rotatably mounted with respect to said second control shaft and is geared to the first control shaft by means of a one-to-one gear train.

In order to permit quick movement over a range of hundreds of kilocycles without the necessity of going through all intervening channel frequencies, a yieldable ball-and-detent coupling is interposed between the first selector shaft and the intermittent drive mechanism. With this arrangement, when the intermittent mechanism is actuated by rotation of the second selector shaft it rotates the first selector shaft and switch arm through the medium of the ball-and-detent coupling, the latter being able to transmit sufficient torque to drive the selector switch, the gear train and the "hundreds" dial. Provision is made for quick rotation of the first selector shaft while the intermittent mechanism is locked, by mounting a knob in such a manner as to be able to rotate the first selector shaft independently. This knob may be mounted directly upon the first selector shaft, or as in the present embodiment, it may be mounted concentrically with the second selector shaft knob so as to perform its driving action through the above-mentioned gear train. In either case, when this first selector knob is rotated it produces rotation of the first selector shaft and switch arm by snapping past the yieldable detent while the intermittent mechanism remains locked in a stationary position. The operation of transferring the tuning of the receiver from any frequency to another frequency which is widely separated from the first consists merely in turning the "hundreds" knob to the desired point corresponding to the "hundreds" of the desired frequency and then turning the "tens" knob to the desired point corresponding to the "tens" of the desired frequency, either rotation being made backward or forward at will. In tuning from a frequency near the extreme upper end of the spectrum to a frequency near the extreme lower end of the spectrum it is not necessary to rotate the "hundreds" knob all the way around; for example, the "hundreds" knob may be rotated from the "15" position to the "5" position by rotating it clockwise two steps.

In the design of the intermittent mechanism, attention was given to the familiar "Geneva" motion. Difficulty was encountered in designing a satisfactory mechanism to provide the required number of 100 kc. control steps, in this case twelve, in the rotation of the first selector shaft, because the arc of contact between the two "Geneva" wheels became exceedingly small and was not effective in locking the first selector shaft during its inactive period. In fact, the tendency was for the two wheels of the "Geneva" mechanism to jam against each other. It was therefore necessary to provide a locking bar actuated by a cam on the second selector shaft and arranged to interlock with a radially slotted wheel on the first selector shaft. The locking bar is disengaged from the slotted wheel only between the "90" and "00" positions of the second selector shaft, permitting the second selector shaft to drive the slotted wheel forward one step during this interval.

Referring to Figures 3 to 6 of the drawings, 31 designates a supporting panel to which is secured in parallel relationship a pair of U-shaped brackets 32 and 33. Journalled in panel 31 and bracket 33 is the first selector shaft 34, said shaft being maintained against endwise shifting by a bearing collar 35 secured to shaft 34 adjacent panel 31 and a bearing collar 36 secured to the end of shaft 34 adjacent bracket 33. Secured to the opposite end of shaft 34 is an insulating arm 37 carrying a conducting plate 38. Conducting plate 38 is adapted to bridge a conductive ring 39 and any one of a plurality of contacts 40 carried on a suitable insulating panel 41 positioned adjacent panel 31 and parallel thereto. Ring 39 is concentric with respect to the axis of shaft 34 and contacts 40 are arranged on a circle concentric with ring 39 and are evenly spaced around said circle. Each contact is connected to a crystal of the "hundreds" series and ring 39 is connected to the "hundreds" oscillator. In the present embodiment, twelve crystals are employed to provide the successive 100 kc. intervals, so that there are twelve contacts 40. Shaft 34 may therefore be rotated so that the twelve crystals may be successively connected to the "hundreds" oscillator.

Journalled in panel 31 and passing rotatably through a shouldered sleeve 42 journalled in bracket 32 is the second selector shaft 43. A bearing collar 44 is secured to shaft 43 adjacent panel 31 to restrain outward endwise movement of shaft 43 with respect to panel 31. Secured to the outer end of shaft 43 is a knob 45 and secured to the inner end of said shaft is an insulating arm 46 carrying a conducting plate 47. Conducting plate 47 is adapted to bridge a contact ring 48 and any one of a series of ten contacts 49. Contacts 49 are equally spaced on a circle concentric with ring 48 and shaft 43, said contacts and ring being carried on panel 41. Each contact 49 is connected to a crystal of the "tens" series and ring 48 is connected to the "tens" oscillator. There are ten crystals, each successively differing in frequency by 10 kc. Shaft 43 may therefore be rotated by knob 45 so that the ten crystals may be successively connected to the "tens" oscillator. Secured to shaft 43 is a transparent dial 50, shown in Figure 3, on which are inscribed ten calibration markings in intervals of ten units from "00" to "90" corresponding to the 10 kc. intervals in a 100 kc. band. Secured to the end portion of sleeve 42 adjacent dial 50 is a second transparent dial 51, also shown in Figure 3, on which are inscribed the calibration markings from "5" to "16" corresponding to the first digits of broadcast frequency "hundreds" from 500 to 1600 kc. Also secured to sleeve 42 is a gear 52, shown in Figures 3 and 5, which meshes with a flanged gear 53 of the same diameter and tooth pitch secured to shaft 34. Secured to sleeve 42 adjacent knob 45 is a knob 54, shown in Figures 3 and 5, which is employed at times to drive shaft 34 through the gears 52 and 53.

Figure 4:
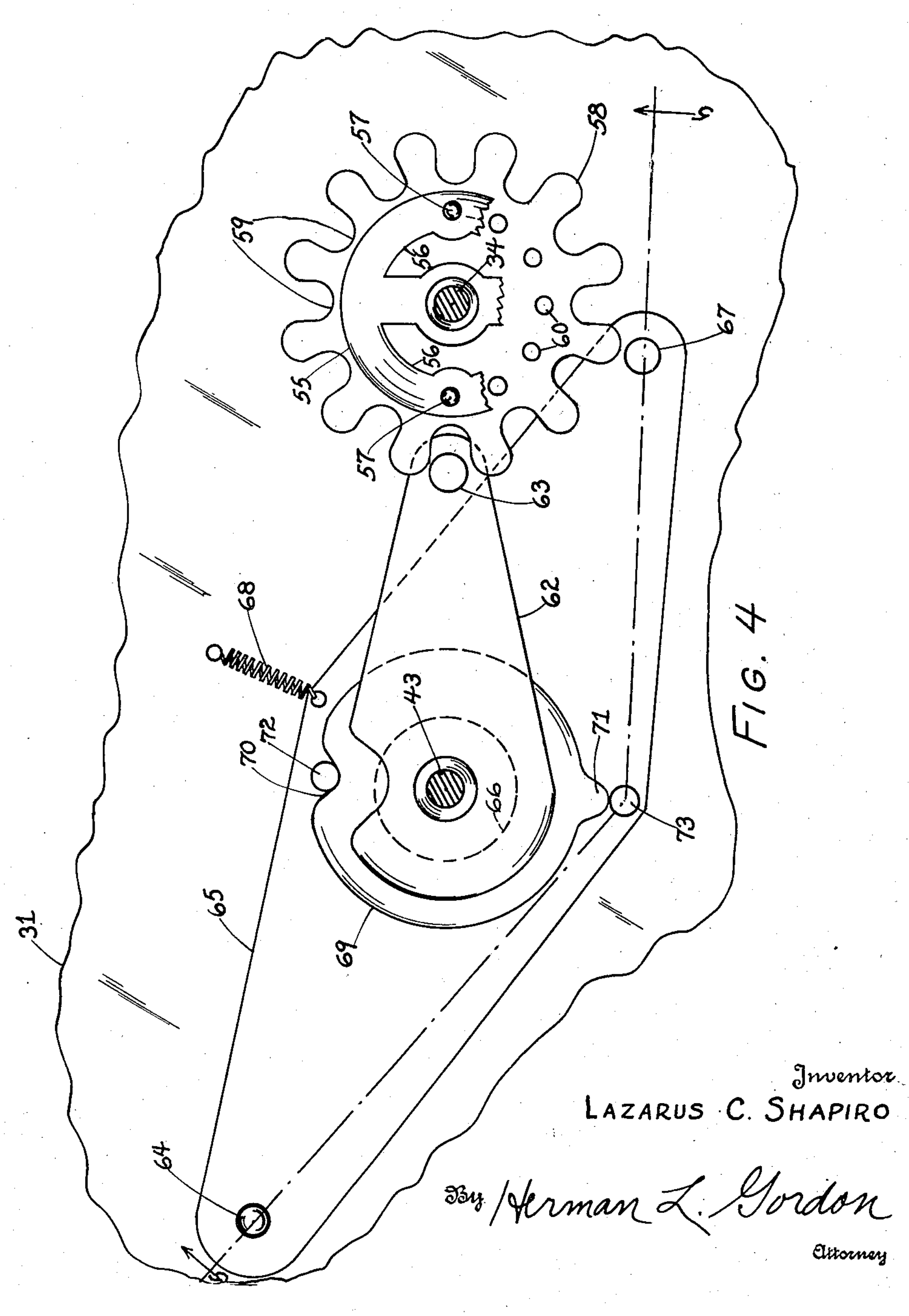
Figure 4 is a cross-sectional detail view illustrating a portion of the mechanism shown in Figure 3, said view being taken on line 4—4 of Figure 5.
Figures 5, 6, 7:
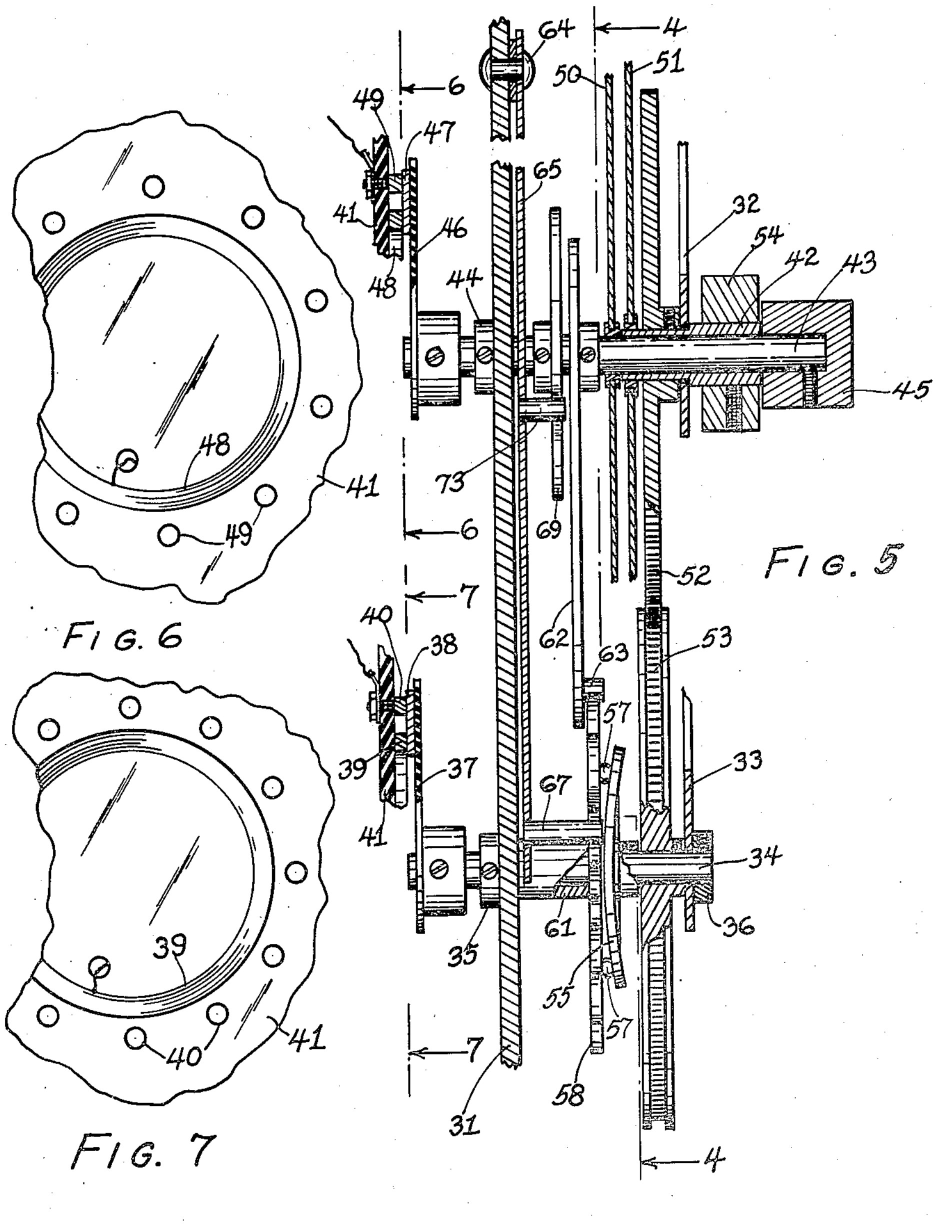
Figure 5 is a cross-sectional view of the mechanism of Figure 3, said view being taken on line 5—5 of Figure 4, and showing in cross-sectional view additional elements of the mechanism not present in Figure 4.
Figure 6 is a view taken on line 6—6 of Figure 5.
Figure 7 is a view taken on line 7—7 of Figure 5.

Secured to shaft 34 is a resilient disc 55, shown in Figures 4 and 5, having substantially semi-circular yieldable portions 56, 56. Midway in each semi-circular portion 56 is formed a recess in which is positioned a ball 57. Rotatably mounted on shaft 34 is a slotted wheel 58, shown in Figures 4 and 5, formed with twelve equally spaced slots 59, and radially aligned with each slot is a recess 60, shown in Figure 4, the recesses being formed on a circle having the same diameter as the distance between the balls 57, whereby said balls are receivable in two diametrically opposed recesses 60 in wheel 58. A spacer sleeve 61, shown in Figure 5, encircles shaft 34 between wheel 58 and panel 31 to provide a bearing for said wheel against the spring pressure exerted thereon by spring disc 55 through balls 57. Said balls, being seated in opposing recesses in the wheel 58 and disc 55 yieldably couple wheel 58 to shaft 34, so that if wheel 58 is rotated shaft 34 follows. However, if wheel 58 is locked, shaft 34 may be rotated by exerting sufficient torque on knob 54 to overcome the spring locking pressure exerted by disc 55.

Secured to shaft 43 is an arm 62, shown in Figures 4 and 5, having at its end portion a projection 63 located so as to enter a slot 59 and rotate wheel 58 through an arc equal to the spacing between slots each time shaft 43 rotates through a complete revolution, or each time the arm 62 swings past the wheel in either direction of rotation of shaft 43.

Pivotally secured to panel 31 at 64 is a locking bar 65, shown in Figures 4 and 5. Shaft 43 passes through an enlarged opening 66 formed in the intermediate portion of the locking bar whereby said bar may oscillate around pivot 64 through a substantial arc without contacting shaft 43. At its free end bar 65 carries a projection 67 adapted to enter a slot 59 in wheel 58 to lock said wheel. Bar 65 is biased toward this locking position by a spring 68 secured to the edge portion of the bar and fastened to panel 31.

Secured to shaft 43 is a cam 69, shown in Figures 4 and 5, which is generally circular in outline except for a recess 70 formed in its periphery and a projection 71 projecting from its periphery substantially diametrically opposite the recess 70. Bar 65 carries a pair of projections 72 and 73 cooperating with recess 70 and projection 71 to positively oscillate bar 65 clockwise around its pivot 64 so as to begin a disengaging movement of projection 67 from wheel 58 shortly before projection 63 begins to engage a tooth of the wheel to rotate the wheel through a "hundreds" step. The disengaging movement continues until projection 67 is fully disengaged from wheel 58, at which time projection 63 has fully entered a slot between two adjacent teeth of said wheel. The disengagement of projection 67 from wheel 58 in the above described manner permits wheel 58 to be rotated by projection 67. Except for this period in the rotation cycle of shaft 43, projection 67 is engaged in a slot of wheel 58 to maintain said wheel locked. Projection 67 returns to locking position in an adjacent slot of wheel 58 shortly before projection 63 moves out of engagement with the wheel, with the result that the position of the wheel is at all times controlled by one or the other of the two projections 63 and 67. Thus, as knob 45 is rotated to rotate shaft 43, the setting of shaft 34 is held locked until shaft 43 has made almost a complete revolution. As dial 50 rotates past the dial window, shown in dotted outline at 74 in Figure 3, and moves from the "90" to the "00" setting thereof with respect to said window, or vice versa, wheel 58 is released and is rotated one step by arm 62 to rotate shaft 34 to the next adjacent "hundreds" position thereof. The rotation of shaft 34 is transmitted through gears 53 and 52 to sleeve 42, whereby "hundreds" dial 51 rotates to the next adjacent setting corresponding to the setting of shaft 34.

Where quick tuning over a range of hundreds of kilocycles is desired knob 54 is rotated with sufficient torque to overcome the spring locking pressure exerted by disc 55, wheel 58 being meanwhile held in locked position by projection 67. This produces rotation of shaft 34 and said shaft may be thus quickly set to a position corresponding to the desired "hundreds" of frequency by reference to dial 51 which moves with knob 54. The rotation of shaft 34 carries along with it spring disc 55 and balls 57, said balls snapping successively into successive recesses 60 in the locked wheel 58 until the desired position of shaft 34 is reached. When the desired "hundreds" frequency has thus been established, the "tens" knob 45 is rotated to the position corresponding to the "tens" of the desired frequency, as indicated on dial 50.

In order to reduce to a minimum parallax errors in reading the juxtaposed numbers on the "hundreds" dial 51 and the "tens" dial 50, said numbers are preferably printed on the inwardly facing surfaces of said dials. Thus, as viewed from the right of Figure 5, the numbers on dial 51 would be printed on the left surface thereof and the numbers on dial 50 would be printed on the right surface of said latter dial.

Although the foregoing structure has been described in connection with certain specific step-tuned receivers employing crystals, it will be obvious that the tuning arrangement herein described is applicable to step-tuned receivers other than crystal-controlled types, and no limitation to crystal-controlled receivers is intended.

While a specific embodiment of a radio receiver tuning arrangement has been disclosed in the foregoing description, it will be understood that various modifications within the spirit of the invention may occur to those skilled in the art. Therefore it is intended that no limitation be placed on the invention other than as defined by the scope of the appended claims.

What is claimed is:

1. In a step-tuned superheterodyne receiver of the type having a coarse step local oscillator and a fine step local oscillator, the combination comprising coarse step frequency selector means controllingly associated with the coarse step local oscillator, a coarse step indicator coupled with said coarse step selector means, fine step frequency selector means controllingly associated with the fine step local oscillator, a fine step indicator coupled with said fine step selector means and mounted concentrically with respect to said coarse step indicator, mechanical means intermittently coupling said coarse step selector means with said fine step selector means, and a shaft mounted concentrically with said indicators and drivingly connected to said mechanical means, whereby both the coarse step selector means and the fine step selector means may at times be simultaneously operated by said shaft 2. In a step-tuned superheterodyne receiver of the type having a coarse step local oscillator and a fine step local oscillator, the combination comprising coarse step frequency selector means controllingly associated with the coarse step local oscillator, a coarse step indicator coupled with said coarse step selector means, fine step frequency selector means controllingly associated with the fine step local oscillator, a fine step indicator coupled with said fine step selector means and mounted concentrically with respect to said coarse step indicator, mechanical means intermittently coupling said coarse step selector means with said fine step selector means, and a single control element mounted concentrically with said indicators and drivingly connected to said mechanical means, whereby both the coarse step selector means and the fine step selector means may at times be simultaneously operated by said single control element.

3. In a step-tuned superheterodyne receiver of the type having a coarse step local oscillator and a fine step local oscillator, the combination comprising a support, a coarse step selector shaft journalled in said support, a fine step selector shaft journalled in said support, a wheel yieldably secured on said coarse step selector shaft, uniformly spaced teeth on the periphery of said wheel, an arm secured to said fine step selector shaft and arranged to meshingly engage with said teeth, a bar pivoted to said support, a projection on said bar engageable between adjacent teeth of said wheel, spring means biasing said bar toward said wheel, whereby said coarse step selector shaft is normally locked, means carried by said fine step selector shaft and arranged to move said bar away from said wheel simultaneously with the meshing of said arm with the wheel, whereby said coarse selector shaft is rotated through a relatively small angle at the end of each complete revolution of said fine selector shaft, a sleeve rotatably mounted on said fine selector shaft, and means drivingly coupling said sleeve to said coarse selector shaft.

4. In a step-tuned superheterodyne receiver of the type having a coarse step local oscillator and a fine step local oscillator, the combination comprising a support, a coarse step selector shaft journalled in said support, a fine step selector shaft journalled in said support, a wheel yieldably secured on said coarse step selector shaft, uniformly spaced teeth on the periphery of said wheel, an arm secured to said fine step selector shaft and arranged to meshingly engage with said teeth, a bar pivoted to said support, a projection on said bar engageable between adjcent teeth of said wheel, spring means biasing said bar toward said wheel, whereby said coarse step selector shaft is normally locked, means carried by said fine step selector shaft and arranged to move said bar away from the wheel simultaneously with the meshing of said arm with the wheel, whereby said coarse selector shaft is rotated through a relatively small angle at the end of each complete revolution of said fine selector shaft, a sleeve rotatably mounted on said fine selector shaft, means drivingly coupling said sleeve to said coarse selector shaft, a fine step indicator secured on said fine selector shaft, and a coarse step indicator secured on said sleeve adjacent said fine step indicator.

LAZARUS C. SHAPIRO.

REFERENCES CITED

The following references are of record in the file of this patent:

UNITED STATES PATENTS

| Number | Name | Date |
|---|---|---|
| 1,622,783 | Heyman | Mar. 29, 1927 |
| 1,917,995 | Polin | July 11, 1933 |
| 2,034,708 | Browne et al. | Mar. 24, 1936 |
| 2,122,183 | Schwarzer | June 28, 1938 |
| 2,148,633 | MacDonald | Feb. 28, 1939 |
| 2,159,749 | Newman | May 23, 1939 |
| 2,176,638 | Nordberg et al. | Oct. 17, 1939 |
| 2,297,389 | Brandholt | Sept. 29, 1942 |
| 2,297,889 | Hoffmann et al. | Oct. 6, 1942 |
| 2,354,148 | Shaw | July 18, 1944 |
| 2,436,172 | Kent | Feb. 17, 1948 |
| 2,467,422 | Bruene | Apr. 19, 1949 |
| 2,470,567 | May | May 17, 1949 |
| 2,487,857 | Davis | Nov. 15, 1949 |